(12) United States Patent
Zebermann et al.

(10) Patent No.: US 6,485,336 B1
(45) Date of Patent: Nov. 26, 2002

(54) CODED ELECTRICAL DEVICE AND METHOD

(75) Inventors: Christoph Zebermann, Beverungen; Dietmar Dux; Manfred Wilmes, both of Detmold; Michael Schnatwinkel, Schmiedestrasse; Rudolf Steinmeier; Walter Hanning, both of Detmold, all of (DE)

(73) Assignee: Weidmuller Interface GmbH & Co., Detmold (DE)

( * ) Notice: Subject to any disclaimer, the term of this patent is extended or adjusted under 35 U.S.C. 154(b) by 0 days.

(21) Appl. No.: 09/490,673

(22) Filed: Jan. 24, 2000

(30) Foreign Application Priority Data

Jan. 25, 2000 (DE) .......................................... 199 02 811

(51) Int. Cl.[7] .............................................. H01R 13/64
(52) U.S. Cl. ........................................ 439/680; 439/677
(58) Field of Search ................................ 439/679, 680, 439/681, 691, 341, 677, 633, 369; 29/631

(56) References Cited

U.S. PATENT DOCUMENTS

| | | | | |
|---|---|---|---|---|
| 3,941,447 A | * | 3/1976 | Hargrave et al. | 439/681 |
| 3,984,169 A | * | 10/1976 | Armstrong et al. | 439/681 |
| 4,224,486 A | * | 9/1980 | Zimmerman, Jr. et al. | 439/681 |
| 4,820,179 A | * | 4/1989 | Saijo | 439/680 |
| 5,273,462 A | * | 12/1993 | Huser et al. | 439/681 |
| 5,318,461 A | * | 6/1994 | Frikkee et al. | 439/680 |
| 6,142,592 A | * | 11/2000 | Grittke et al. | 439/681 |

FOREIGN PATENT DOCUMENTS

| | | | |
|---|---|---|---|
| DE | P 28 33 777.1-34 | * | 10/1979 |
| DE | G 88 05 197.8 | * | 7/1988 |
| DE | 38 30 187 A1 | | 3/1990 |
| DE | G 92 08 701.9 | * | 2/1993 |
| DE | 197 10 768 A1 | * | 9/1998 |

* cited by examiner

*Primary Examiner*—Hien Vu
(74) *Attorney, Agent, or Firm*—Lawrence E. Laubscher, Sr.

(57) ABSTRACT

A coding arrangement is connected between a pair of components that are to be laterally displaced into engagement with each other, thereby to assure that only authorized components may be connected with each other. The coding assembly includes a pair of matching coding elements one of which has at least one projection that carries a pair of angularly arranged coding surfaces which engage a corresponding pair of coding surfaces on the other coding element. According to the method of assembly provided by the invention, the coding elements are mounted on the ends of a synthetic plastic strap by tear strip means, and the strap is deformed to bring the coding elements together into coded engagement with each other, thereby to form a preassembled coding assembly. One coding element of this preassembled coding assembly is initially mounted on one of a pair of components, such as a terminal board to which an authorized printed circuit board or the like, which are to be physically mounted and electrically connected. The components are then brought together to cause the other matched coding element of the preassembled coding assembly to be connected with the other component. The mounting strap is then rotated relative to the coding elements, whereupon the tear strips are broken to separate the strap from the coding elements, which coding elements remain mounted on the components.

14 Claims, 7 Drawing Sheets

PRIOR ART

CODED ELECTRICAL DEVICE AND METHOD

BACKGROUND OF THE INVENTION

1. Field of the Invention

This invention relates to a coding arrangement including a pair of matched coding elements that are respectively connected between a pair of components, such as a terminal block and a printed circuit board, so that only authorized components can be electrically connected with each other. The invention also relates to a method for mounting the coding elements on their respective components.

2. Background of the Invention

Various coding arrangements are well known in the prior art. In the German patent No. DE 38 30 187, for example, there is disclosed a coding device for switchboard plug-in modules for the purpose of definite match up of plug-in modules and plug-in chambers with the help of coding projections on the module and coding devices corresponding therewith on the module support. The coding projections are attached on the underside of a module bottom, standing perpendicularly in a row at a right angle to the direction of insertion. On the bottom sheet metal piece of the module block, there is provided a coding plate with grooves located in the direction of insertion whose interval corresponds to the interval between the coding projections. The coding projections protrude into the grooves. Coding systems such as these entail the disadvantage that coding in practice is often dispensed with due to the effort connected with assembly. But this can lead to problems or damage, for instance, because various potentials, (for example, 24 V and 230 V) can be combined.

Figure 6A:
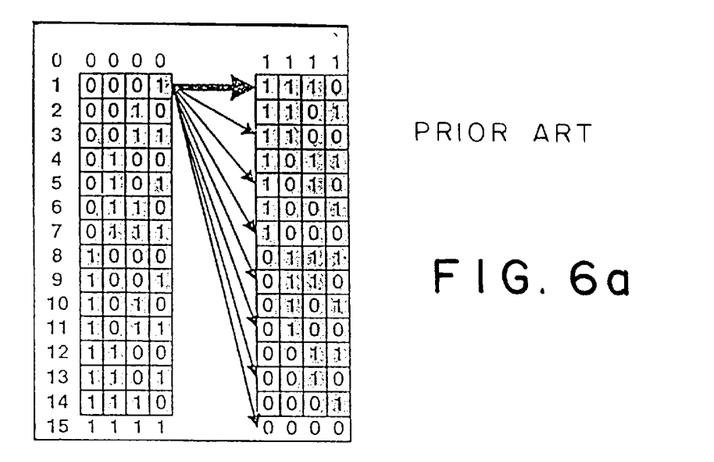
FIGS. 6a and 6b illustrate two further coding arrangements for the connectors.
Figure 6B:
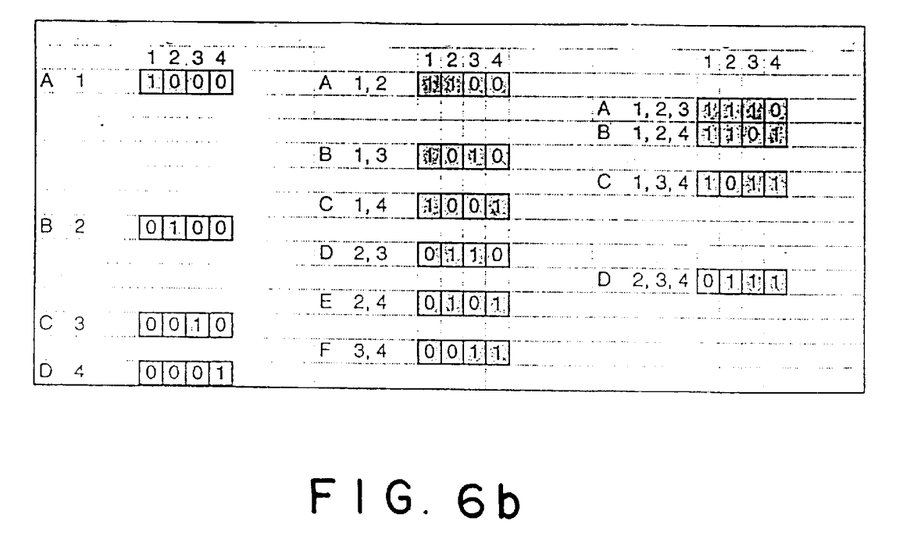

According to the prior art coding arrangement of FIG. 6, the problem arises that codings with few projections can be stuck into coding receptacles with free socket holes. For instance, pin "1" in FIG. 6 can be stuck not only in socket "1" but also into sockets "3, 5, 7, 9, 11, 13, 15." This does not reliably rule out the possibility of making a mistake in sticking the pin in. The problem therefore is this, as FIG. 6 furthermore shows by way of example: If one has a total of four peg locations with one and three projections, then out of the theoretical 16, one can make only four coding variants that really differ from each other. If there are five peg positions, then there are ten genuine differentiation possibilities.

Starting with this state of the art, the present invention is intended to provide a simple coding system that is distinguished by high coding assurance and a large number of coding variants that can also be implemented in a narrow space. Another part of this problem involves ensuring the fact that the coding device can be assembled in an uncomplicated and quick manner.

The present invention was developed to avoid the above and other drawbacks of the known coding systems.

SUMMARY OF THE INVENTION

Accordingly, a primary object of the present invention is to provide a coding arrangement in which a pair of coding elements are connected between a pair of authorized components, such as a terminal block and a printed circuit board, whereby only the authorized pair of components can be displaced together toward a fully connected position.

According to a more specific object of the invention, the pair of coding elements each include a pair of angularly arranged coding surfaces each contained in a plane normal to the direction of connection of the components, the corresponding coding surfaces of the coding elements being parallel with each other. One of the coding elements includes a male projection or peg that extends in the direction of the other coding member and that carries one pair of angularly arranged coding surfaces. The corresponding pair of angularly arranged coding surfaces is formed either on projections on the other coding element, or on the walls of a non-circular female socket. The projections and/or sockets that can be assembled in each case essentially have a polygonal cross-section and form a part of a base surface—in particular, a regular polygon or a non-circular surface—on which they are aligned according to a coding system where the projections of the first and the projections and/or sockets of the second coding element in each case essentially rest with one of their outer sides against the circumference of the base surface and where, in case of different coding element variants, they rotate along the circumference of the base surface or are twisted with respect to each other. This coding system ensures a large number of coding variants so that any confusion can be eliminated. This is true, in particular, when two or more of these base surfaces or polygons are lined up directly along each other; one then gets a particularly large number of different reliably plugged-in coding variants in conjunction with the definite position match up (ensuring against twisting) of the components that are provided with the coding device; this can be done in a very tight space.

According to another object of the invention, the corresponding projections and/or sockets essentially have rectangular cross-section that amounts to about half the surface of the base surface that is made as a square area. It is furthermore practical when one of the longitudinal sides of the rectangular projections or sockets rests against one of the outer sides of the square area and/or when the surfaces of the different projection/projection or projection/socket combinations partly overlap each other. This coding system facilitates on a single square area—with an edge that, for instance, amounts to only a few millimeters—the implementation of four different coding variants. The number of coding variants can be multiplied by lining up these square areas to receive the rectangular projections and sockets. In that way, with two areas lined up to each other in a narrow space, one can already implement 16 coding variants, and with three areas lined up next to each other in a row, one can make even 64 coding variants on a particularly narrow surface.

As another preferred embodiment that implements even more coding variants on one base surface, the base surface is made as a hexagon; the pegs are made as half-hexagonal surface or as a third of the hexagonal surface (135" element) and the pins for various coding variants are offset with respect to each other along the outer circumference in 60° steps. That idea can be carried forward with any number of hexagons; as the number of corners increases, one can, of course, theoretically increase the wide variety of coding variants on one base surface. But some time along the way, one encounters the problem of peg positions that will differ only very little from each other if the base surface is presumed to remain equally large.

The invention, moreover, solves another problem according to a particularly preferred embodiment. In electrical appliances, where in all units a uniform first component must be combined with a different second component, in other words, in electrical appliances that are built up on the basis of terminal blocks, which must be provided with different electronic housings, it so happens that storage is made more difficult by the coding devices, because for each electronic housing with the first coding element section, one must keep in stock a fitting terminal body with the corresponding second coding element section. To solve this problem, the two coding element sections can together be placed upon the first component and are so designed that when the two components are assembled, the second coding element section will so come to rest against the second component that upon separation of the two components from each other, the second coding element section will remain on the second component so that it forms a counterpart for the first coding element section that remains on the first component when the two components are separated from each other.

The present invention is particularly suitable for this embodiment, since the second coding element section that is attached to the base terminal unit is so made that when the housing is the set upon a base component, for example, the base terminal block, it will be retained in a recess in which it remains after removal of the housing from the base terminal block so that it forms the counterpart for the first coding element section that remains on the electronic housing upon the withdrawal of the electronic housing. In contrast to the prior art, this offers the following advantage: one of the two components, in particular, the base terminal units, during their production need not be provided with any coding device or with any of the coding element sections so that the storage of these components is considerably simplified. The electronics units of varying types—for example, electronics units to implement communication between a first field bus and actors, initiators, etc.—on the other hand, are in each case provided with a differing, bipartite coding element; the second coding element section is "put down" upon the base terminal unit only when the electronic unit is first put on the base terminal unit. In case the electronic unit is exchanged later, the second coding element section remains on the base terminal unit and protects the electrical appliance that is made up of the base terminal units against inadvertent imposition of a "false" electronic unit with a coding that does not fit. This idea can be combined particularly advantageously with the invention-based coding system that can be made in a narrow space.

With regard to the second part of the problem that can also be contemplated independently, that is, to ensure that the coding device can be assembled in an uncomplicated and fast fashion, the invention solves the problem in the following manner: The two coding element sections of each coding element are connected integrally via constrictions or rip-off edges with a flexible base unit, in particular, a handle upon which the two coding element sections can be assembled to form one coding element. The handle is preferably made as a plastic strap that can be bent by hand. The plastic strap is so dimensioned that the two coding element sections of the two coding elements that belong together can in each case be put together at the strap to form the coding element; therefore, one can reliably rule out any confusion during assembly. Besides, the handling is simple and one can prevent a situation where one must try to match up two mutually fitting elements during assembly. This high degree of safe assembly is further enhanced by a legend that is affixed upon the handle.

Another object of the invention is to provide a method for easily making the various coding devices of the coding system. For this purpose, one preferably provides a single mold with a number of recesses that corresponds to the number of coding variants to make the different variants of coding element sections so that all variants can be made in just one production cycle. The manufacturing process is further simplified in the following manner: For the various coding elements, different numbers of recesses are provided in the mold so as to corresponds to their frequency distribution. In a particularly preferred manner, the differing coding variants are assembled to form groups in the mold in keeping with the frequency arising from the particular purpose (for example, three groups: particularly frequently needed coding variants, normally frequent variants, rare variants). In this way, when one uses only one single tool, one can avoid the unnecessary production of variants that occur very infrequently.

BRIEF DESCRIPTION OF THE DRAWINGS

Other objects and advantages of the invention will become apparent from a study of the following specification, when viewed in connection with the accompanying drawings, in which.

DETAILED DESCRIPTION

Figures 1, 2:
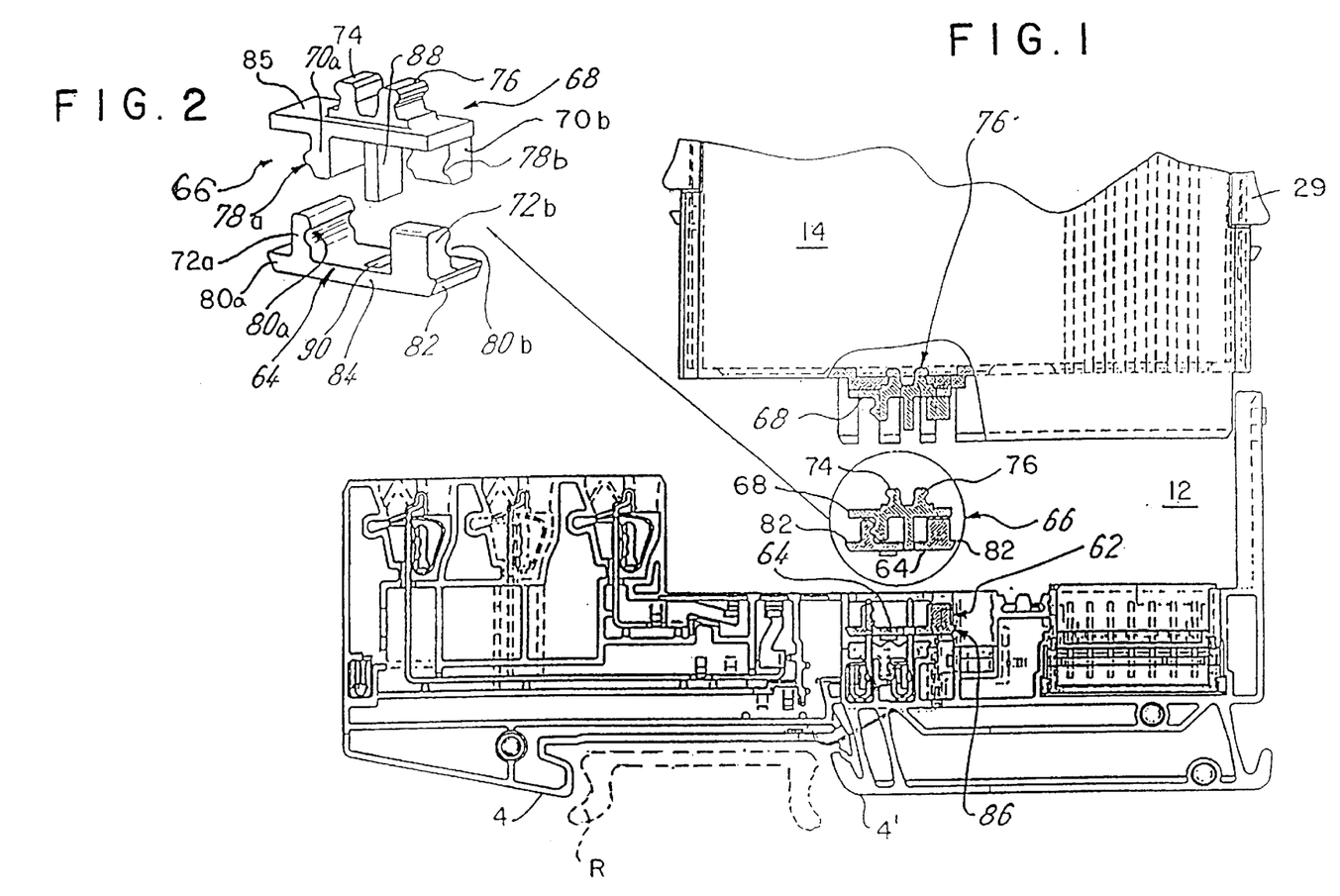
FIG. 1 is a detailed exploded view of the connection between the printed circuit board and the terminal block.
FIG. 2 is an exploded detailed view of the pair of coded connector elements.

Referring to FIG. 1, the terminal block 2 includes foot portions 4, 4' for the mounting thereof on a support or mounting rail R, said terminal block containing on its upper surface a mounting recess 12 for receiving a printed circuit board 14 having a frame or housing 29, as is known in the art.

In accordance with the present invention, coding means 66 are provided for assuring that only an authorized printed circuit board is connected with the terminal block 2. These coding means include a first distinctive coading member 64 that is connected with the terminal block 2, and a second corresponding distinctive coding member 68 that is supported within a further mounting recess 62 contained in the upper portion of terminal block 2. The second coding member 68 includes a pair of upwardly extending fastening projections 74, 76 that extend within corresponding locking openings contained within the printed circuit board housing 29, thereby to fasten the coding element 68 to the printed circuit board.

As shown in FIG. 2, the upper coding element 68 includes a centering lug 88 that extends downwardly within a corresponding centering opening 90 contained in the lower coding element 64. In accordance with a characterizing feature of the invention, the upper coding member 68 includes a body portion 85 having a pair of downwardly extendings pegs 70a and 70b that carry a pair of orthongonally arranged locking ribs 78a and 78b that extend in locking engagement within corresponding orthogonally arranged locking grooves 80a and 80b carred by pegs 72a and 72b that extend upwardly from the body portion 84 of the lower coding element 64. Thus, a given printed circuit board 14 can be connected with an authorized terminal block 2 only when the two components are provided with a matching pair of coding elements 64 and 68.

As best shown in FIG. 1, the body 84 of the lower coding member 64 has chamfered end surface 82 that are snapped into corresponding undercut fastening recesses 86 contained in the opposed end walls of the terminal block mounting recess 62, thereby to fasten the coding member 66 to the terminal block.

Figure 3A:
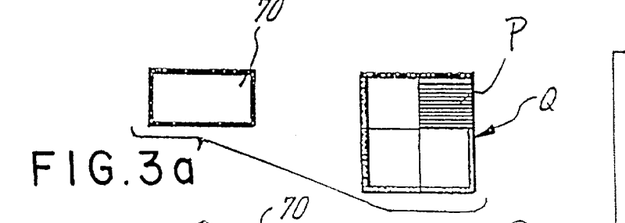
FIGS. 3a–3c are diagrammatic illustrations of cross sections of the male projections that are portions of a square, a hexagon and an octagon, respectively.
Figure 3B:
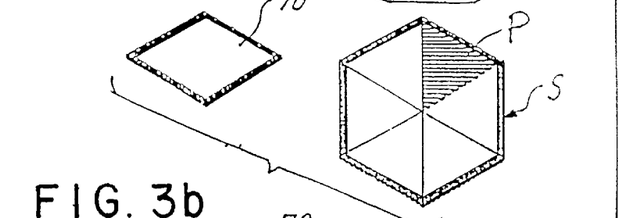
Figure 3C:
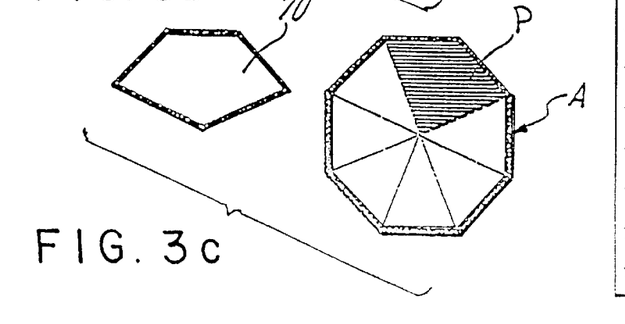
Figure 3D:
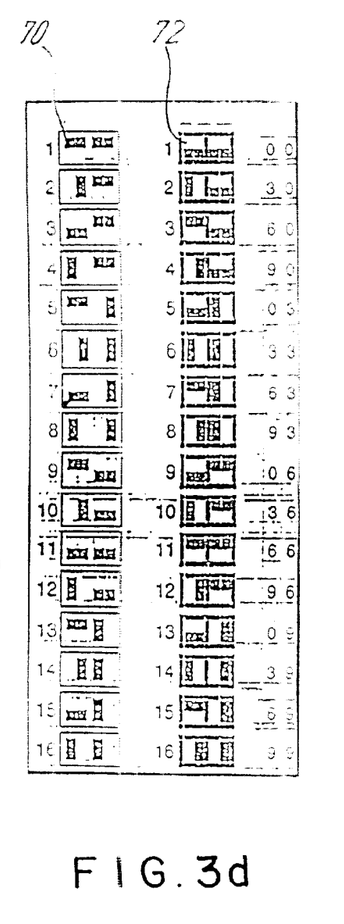
FIG. 3d is a schematic view of a coding connector having a plurality of pairs of corresponding code patterns.
Figure 4A:
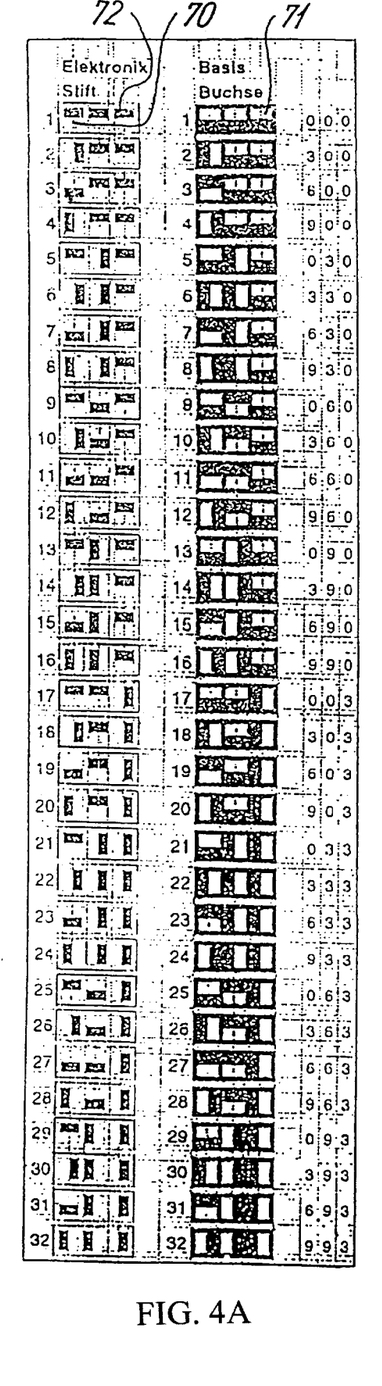
FIGS. 4a and 4b illustrate two further connectors having pairs of corresponding code patterns.
Figure 4B:
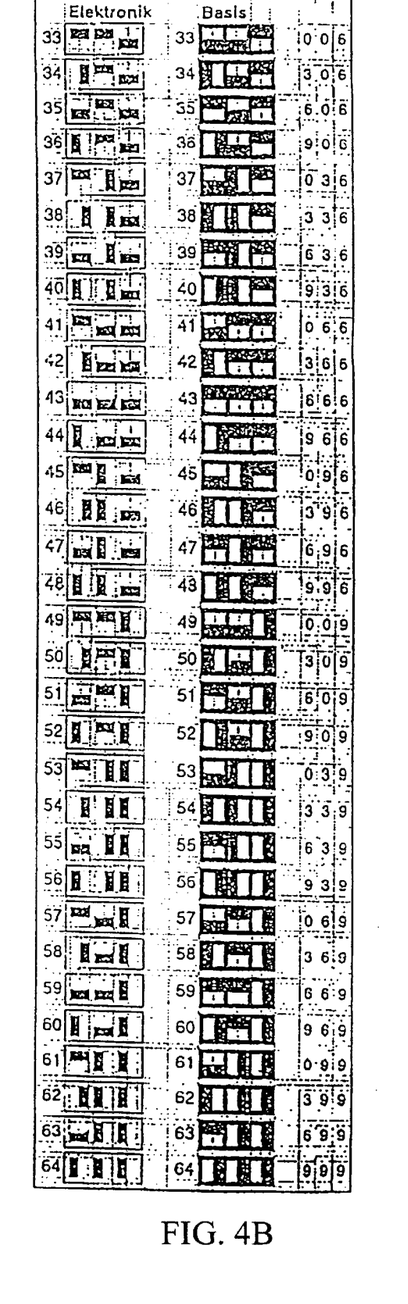

Referring now to FIGS. 3a–3d, the corresponding pairs of coding elements may have different cross-sectional configurations based, for example, on square-shaped pegs and openings (FIG. 3a), hexagonal pegs and openings (3b), and octagonal squares and openings (FIG. 3c). Corresponding peg and recess coding arrangements are illustrated in FIG. 3d, FIG. 4a, and FIG. 4b.

Figure 5A:
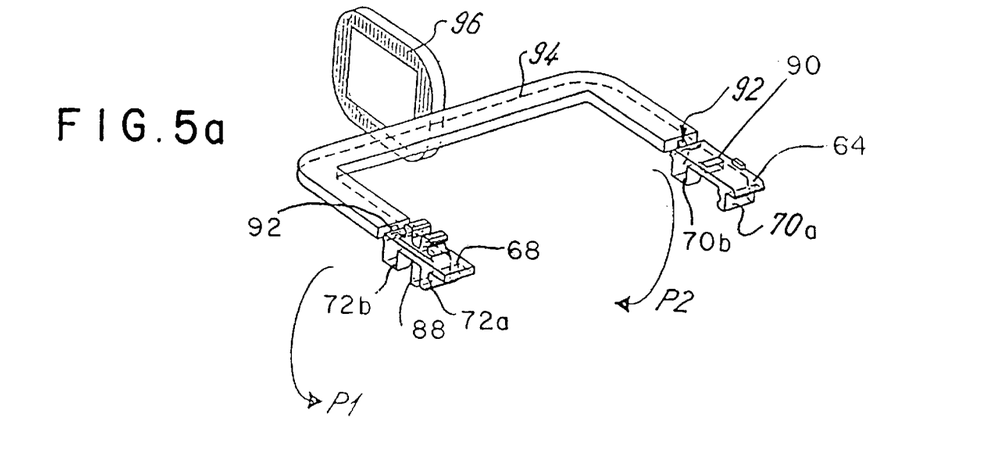
FIGS. 5a–5e' are diagrammatic views illustrating te method steps of forming a pair of coding elements in accordance with the present invention.
Figure 5B:
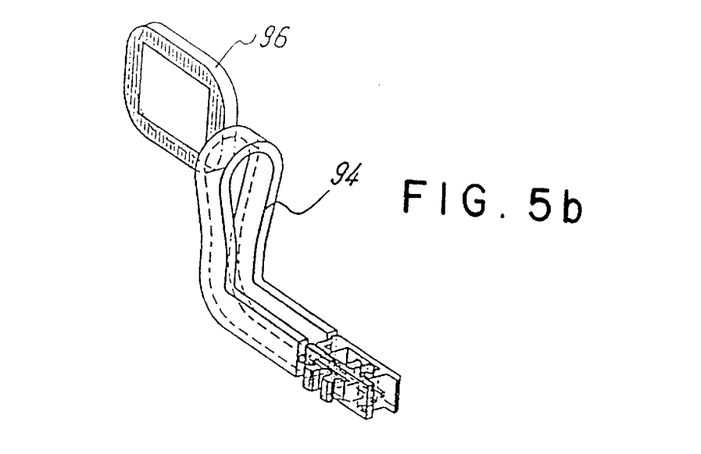
Figure 5C:
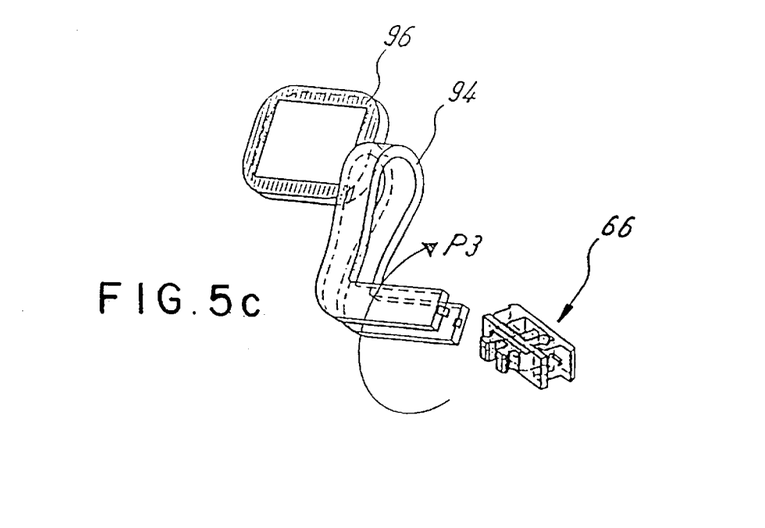
Figure 5D:
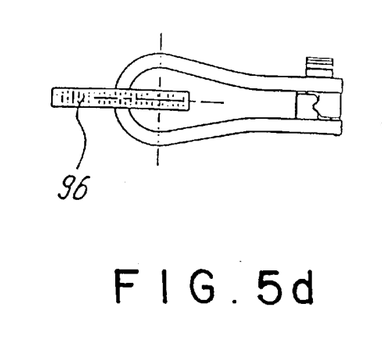
Figure 5E:
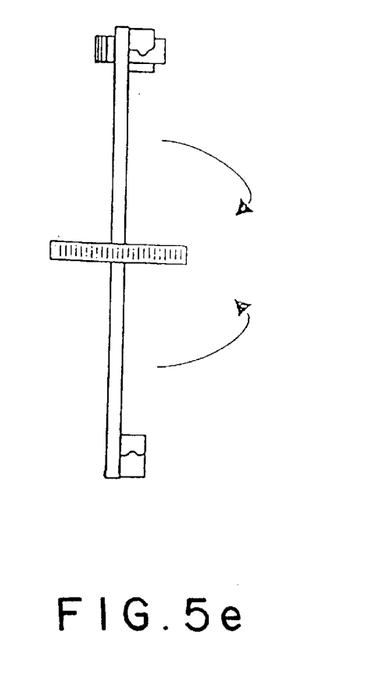

According to an important feature of the invention illustrated in FIGS. 5a–5e', handle means 96 are provided for storing, transporting and installing a pair of matching coding elements 64 and 68 on a pair of associated components, respectively. As shown in FIG. 5a, the coding members 64 and 68 are connected by break-away connections 92 with the free ends of the leg portions of a flexible U-shaped carrier member. The transverse portion 94 of the carrier is connected at its middle with the handle 96. When the leg portions of the carrier 94 are folded together as shown by the arrows $P_1$ and $P_2$ of FIG. 5a, the orthogonally arranged coding surfaces 78a and 78b on the pegs 70a and 70b of the coding member 64 are brought into locking engagement with the corresponding orthogonally arranged suraces 80a and 80b on the pegs 72a and 72b of the coding member 64, respectively. The breakaway connections 92 are then broken to separate the coding means 66 from the handle carrier 94, as shwon bythe arrow $P^3$ in FIG. 5c. Thus, the handle 96 and the U-shaped strap 94 facilitate the handling and installing of the coding elements. Indentifying indicia 98 carried by the carrier portion 94 of the handle means identify the specific coding pattern of the arrangement.

FIGS. 6a and 6b illustrate the various coding arrangements possible with 4 coding recesses and one, two, and three coding pegs, respectively.

Figures 7A, 7B:
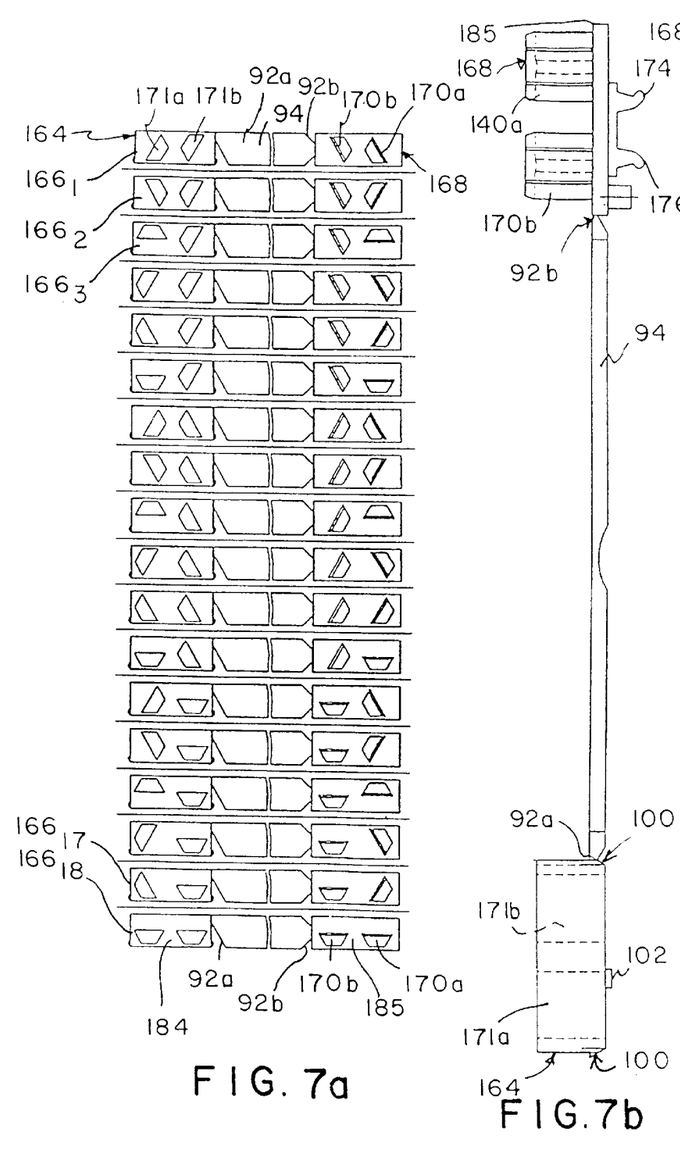
FIG. 7a is a front view of a plurality of different pairs of coded connectors.
FIGS. 7b and 7c are right side and front views illustrating the method of manufacture of a given pair of coded elements.
Figure 7C:
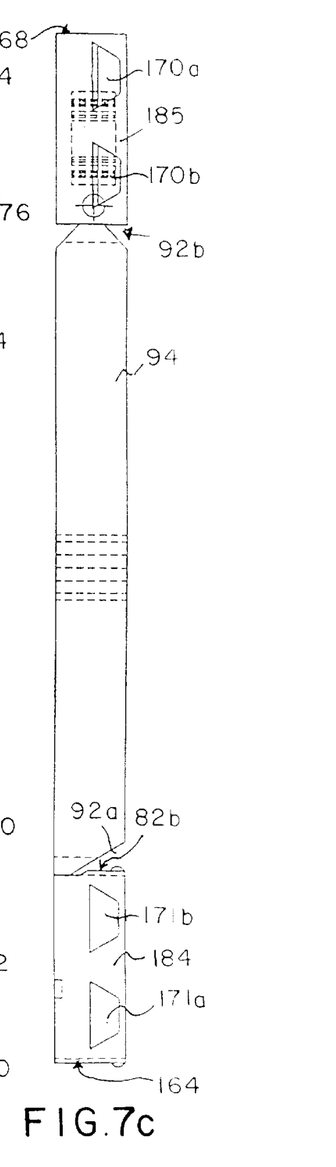

Referring now to the modification of FIGS. 7a–7c, each of the male coding projections 170a and 170b of die coding body 185 connected with one end of the cier 94 and the corresponding female recesses 171a and 171b contained sin the companion body 184 connected with the other end of the carrier 94 has a 4-sided half-hexagonal cross-sectional configuration. The coding projections and recesses of the successive arrangements $166_1, 166_2, 166_3 \ldots 166_{18}$ are rotated in a simple manner through various multiples of 60°, thereby to produce the desired coding patterns.

According to a further feature of the invention, the breakaway cut 92a between each carrier 94 and the lower coding member 164 includes an undercut 100, whereby the fastening beveled edge 82b extends about halfway across the coding member base portion 184, as shown in FIG. 7c. This offers the advantage that, if desired, the coding member 164 may be disengaged from the associated fastening recess 86 of the terminal block 2 by laterally displacing the coding member—by a screwdriver, for example—relative to the terminal block and the recess 86 (FIG. 1), whereby the coding element 164 is removed from the mounting recess 62 for replacement by another coding member. Thus, the inadvertent withdrawal from base terminal block 2, perpendicularly upwardly, is rendered impossible. A projection 102, molded upon the bottom of base portion 184, is fiheore designed to engage a correspondingly shaped recess (not shown) on base terminal block 2 so that one can also prevent the inadvertent lateral shifting on base terminal block 2. On the other hand, a deliberate shift is possible, for example, with the aid of a screwdriver.

What is claimed is:

1. A coding arrangement for permitting a first component to be connected only with an authorized second component, comprising:

(a) first and second (64, 68; 164, 168) mating coding members having parallel spaced generally rectangular flat base portions (84, 85; 184, 185), each of said flat base portions having generally parallel top and bottom surfaces, the flat base portion of a first one of said coding members including at least one male code projection (70; 170) that extends toward said second coding member, the base portion of said second coding member having a corresponding coding means (72; 171) that cooperates with said one coding projection;

(b) a pair of electrical components (2, 14) that are to be connected with each other, a first one of said components containing a first mounting recess (62) adjacent the other of said components, said mounting recess having opposed end walls containing fastening recesses (86);

(c) first fastening means for fastening said first coding member within said mounting recess, said fastening means including beveled end surfaces (82) at the opposite ends of said base portion of said first coding member, said beveled end surfaces being in engagement with corresponding ones of said fastening recesses (86) contained in said end walls of said mounting recess, respectively, the length of one of said beveled end surfaces (82b) being less than the width of said first coding member base portion (184), thereby to permit lateral displacement of said first coding member by a removal tool relative to said first component, whereby said beveled end is removed from its associated fastening recess for removal of said first coding member from said first mounting recess; and (d) second fastening means (74, 76; 174, 176) for fastening said second coding member base portion with the second one of said components.

2. A coding arrangement as defined in claim 1, wherein one of the components comprises a terminal block (2) mounted on a support rail (R), and further wherein the other of said components comprises a printed circuit board (14) having a housing (29) adapted for mounting in a second mounting recess (12) contained in said terminal block.

3. A coding connector arrangement as defined in claim 1, and further including strap means (94) removably connected with said coding elements for orienting said elements relative to each other during the connection thereof with their associated components, respectively.

4. A coding arrangement as defined in claim 1, wherein one of said coding members includes a guide projection (88) having a non-circular cross-sectional profile, and further wherein the other of said coding members contains a bore (90) for receiving said guide projection, said bore having a cross-sectional profile that corresponds with the cross-sectional profile of said projection.

5. A coding arrangement as defined in claim 1, wherein said base portion of said fist coding member includes an integral stop projection (102) that cooperates with a corresponding recess contained in the associated component, thereby to prevent lateral displacement of said coding element relative to said component.

6. A coding arrangement as defined in claim 1, wherein the coding stop surfaces of each pair of connector elements are orthogonally arranged, and wherein the cross-section of said male projection (70) corresponds with one-half of a square (Q).

7. A coding arrangement as defined in claim 1, wherein said male projection (70) has the cross-section of a portion of a hexagon (S), said coding stop surfaces on said male projection being arranged at an angle of 60 degrees relative to each other.

8. A coding arrangement as defined in claim 1, wherein said male projection (70) has the cross section of a portion of a hexagon (A), said coding stop surfaces on said male projection being arranged at an angle of 45 degrees relative to each other.

9. A coding arrangement as defined in claim 1, wherein the coding stop surfaces on the other of said coded elements are carried by a female socket opening operable to receive said male projection.

10. A coding arrangement for permitting a first component to be connected only with an authorized second component comprising:
   (a) first and second (64, 68; 164, 168) mating coding members having parallel spaced generally rectangular base portions (84, 85; 184, 185), the base portion of a first one of said coding members including at least one male code projection (70; 170) that extends toward said second coding member, the base portion of said second coding member leaving a corresponding coding means (72; 171) that cooperates with said one coding projection;
   (b) a pair of electrical components (2, 14) that are to be connected with each other, a first one of said components containing a first mounting recess (62) adjacent the other of said components, said mounting recess having opposed end walls containing fastening recesses (86);
   (c) first fastening means for fastening said first coding member within said mounting recess, said fastening means including beveled end surfaces (82) at the opposite ends of said base portion of said first coding member, said beveled end surfaces being in engagement with corresponding ones of said fastening recesses (86) contained in said end wall of said mounting recess, respectively; and
   (d) second fastening means (74, 76; 174, 176) for fastening said second coding member base portion with the second one of said components;
   (e) each of said first and second coding members including a plurality of male projections (70a, 70b; 72a, 72b) that extend adjacent each other, respectively, the projections of a first one of said coding members having lateral surfaces that are provided with orthogonally arranged fastening ribs (78a, 78b) that extend within corresponding lateral fastening grooves (80a, 80b) provided in the lateral surfaces of the projections of said second coding member.

11. A coding arrangement comprising:
   (a) a pair of initially spaced coding members (64, 68; 164, 168);
   (b) a single linear flexible strap (94) extending between said coding members; and
   (c) tear connection means (92) connecting the ends of said strap with said coding members, respectively;
   (d) one of said coding members having distinctively arranged male coding projections, and the other of said coding members having corresponding matching coding means, said coding members being arranged for cooperative engagement when said strap is folded intermediate its ends to bring said coding elements opposite each other;
   (e) said tear connection means being such that each coding member is separable by tearing upon rotary motion of said coding member relative to said strap; said tearing means defining on one of said coding members a pair of beveled end surfaces (82) operable to fasten said one coding member between a pair of opposed fastening recesses (86) contained in a mounting recess (62) within, which said one coding member is mounted, said tearing means being such that the length of at lest one of said beveled end surfaces (82b) is about one-half the width of said one coding member, thereby to permit twisting of said one coding member in a direction permitting removal thereof from said mounting recess.

12. A coding arrangement comprising:
   (a) a pair of initially spaced coding members (64, 68; 164, 168);
   (b) a single linear flexible strap (94) extending between said coding members; and
   (c) tear connection means (92) connecting the ends of said strap with said coding members, respectively;
   (d) one of said coding members having distinctively arranged male coding projections, and the other of said coding members having corresponding matching coding means, said coding members being arranged for cooperative engagement when said strap is folded intermediate its ends to bring said coding elements opposite each other;
   (e) said strap having a generally U-shaped configuration including an intermediate portion (94), and a pair of leg portions carrying at their free ends said coding members, respectively.

13. A coding arrangement as defined in claim 12, and further wherein said strap includes a handle (96) on said intermediate portion.

14. A coding arrangement as defined in claim 13, wherein said intermediate portion is adapted to carry indicia (98).

* * * * *